United States Patent [19]
Murase et al.

[11] Patent Number: 5,315,536
[45] Date of Patent: May 24, 1994

[54] METER DRIVING SYSTEM

[75] Inventors: Hiroshi Murase; Kazuyuki Fukuda, both of Kyoto, Japan

[73] Assignee: Rohm Co., Ltd., Kyoto, Japan

[21] Appl. No.: 863,716

[22] Filed: Apr. 3, 1992

[30] Foreign Application Priority Data

Apr. 9, 1991 [JP] Japan .................................. 3-076362
Sep. 10, 1991 [JP] Japan .................................. 3-230511

[51] Int. Cl.[5] ........................ G01P 3/48; G01R 11/36
[52] U.S. Cl. .................................. 364/569; 364/565; 324/143; 324/166; 324/167
[58] Field of Search .................. 364/431.07, 505, 569; 324/143, 144, 146, 166, 167

[56] References Cited

U.S. PATENT DOCUMENTS

| 4,928,060 | 5/1990 | Ito | 324/143 |
| 5,017,861 | 5/1991 | Hukuda | 324/143 |
| 5,051,688 | 9/1991 | Murase et al. | 324/143 |
| 5,218,291 | 6/1993 | Murase | 364/565 X |

FOREIGN PATENT DOCUMENTS

| 0341445 | 11/1989 | European Pat. Off. |
| 0370616 | 5/1990 | European Pat. Off. |
| 0401757 | 12/1990 | European Pat. Off. |

OTHER PUBLICATIONS

Patent Abstracts of Japan, vol. 14, No. 286, p. 1064, Dated Jun. 20, 1990, Pub. No. JP 2085764.

Primary Examiner—Jack B. Harvey
Assistant Examiner—Eric W. Stamber
Attorney, Agent, or Firm—Oliff & Berridge

[57] ABSTRACT

A meter driving system measures a period of input signals, and operates meters based on the measured period data. When no period data arrive in a preset period of time after the last period data, the lapsed time is treated as the period data so as to renew the meter indication. The meter driving system is very responsive to a signal whose frequency is gradually decreased, thereby giving the indication with little delay.

26 Claims, 8 Drawing Sheets

METER DRIVING SYSTEM

BACKGROUND OF THE INVENTION

1. Field of the Invention

This invention relates to improvement in a system for driving meters such as a speedometer or a tachometer in response to an output from a speed or rotation sensor, and so on.

2. Description of the Related Art

A plurality of meters are used in a vehicle. They include a speedometer, a tachometer, a water temperature gauge, an oil pressure gauge, a boost gauge, and so on. These meters are operated by a driving system.

Figure 8:
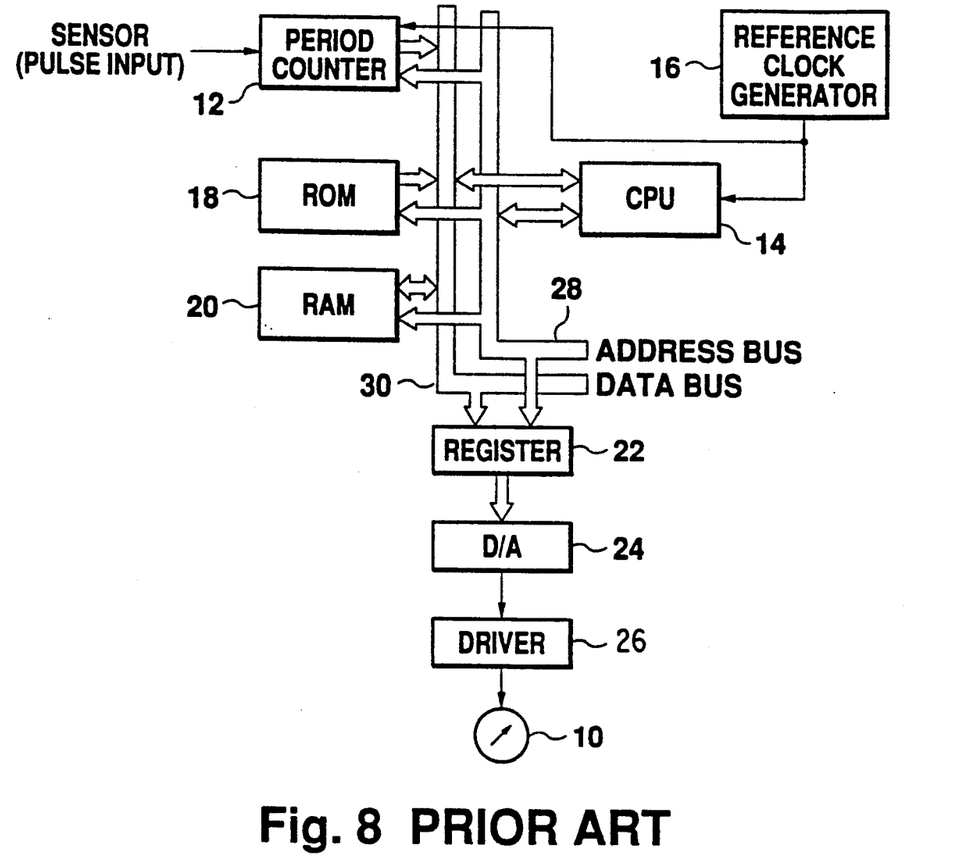
FIG. 8 is a block diagram showing the configuration of an example of a conventional system.
Figure 9:
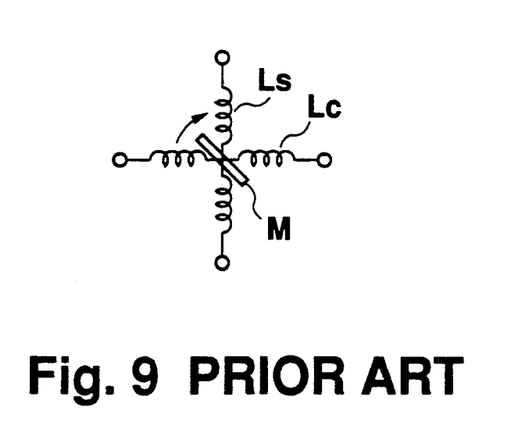
FIG. 9 shows excitation coils.

FIG. 8 of the accompanying drawings shows the configuration of an example of a conventional meter driving system. The meter driving system operates a cross-coil meter 10. The cross-coil meter 10 includes two coils which are crossed as shown in FIG. 9. A meter pointer is moved in response to a current supplied to these coils.

The two excitation coils $L_S$ and $L_C$ generate magnetic fields having desired angles and orientations when a pulse current having a pulse width corresponding to input data such as speed is supplied to the coils. A rotatable permanent magnet M receives torque generated by the magnetic fields of the coils $L_S$ and $L_C$.

Figure 10:
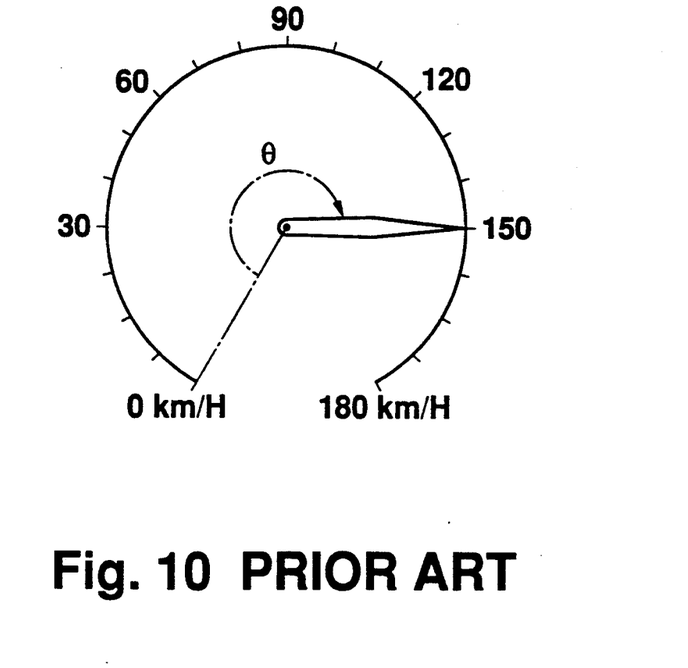
FIG. 10 shows a cross-coil meter.

The pointer connected to the magnet M moves by angle $\theta$ from a reference position so as to indicate a value (a speed in FIG. 10), according to the input, on a meter panel.

The meter driving system of FIG. 8 comprises a period counter 12, a CPU 14, a reference clock generator 16, a ROM 18, a RAM 20, a digital to analog converter 24, a driver 26, an address bus 28 and a data bus 30.

The period counter 12 receives a pulse output from a sensor, and measures a period of the pulse. It is assumed here that the pulse period corresponds to a detected result (e.g. speed). In this case, the period counter 12 measures the interval (period) of the leading edge or the trailing edge of the pulse based on the number of the reference clocks, which are periodically generated by the reference clock generator 16. The period of the sensor output measured by the period counter 12 is transmitted to the data bus 30 as data, which is then forwarded to the CPU 14. In this case, the period is measured instead of frequency so as to be compatible with a low frequency output from the sensor.

The CPU 14 processes the output from the period counter 12 according to a program stored in the ROM 18. The RAM 20 is used as a work area for the CPU 14. The calculated result of the CPU 14 is sent to the data bus 30 so as to be latched in the register 22.

The register 22 latches the output from the CPU 14, supplying the output to the digital to analog converter 24 serving as a PWM modulator. The CPU 14's output which is subject to the digital to analog conversion is supplied to the driver 26. The driver 26 operates the cross-coil meter 10 accordingly. In other words, the output current from the driver 26 flows through the coils $L_S$ and $L_C$.

Figure 11:
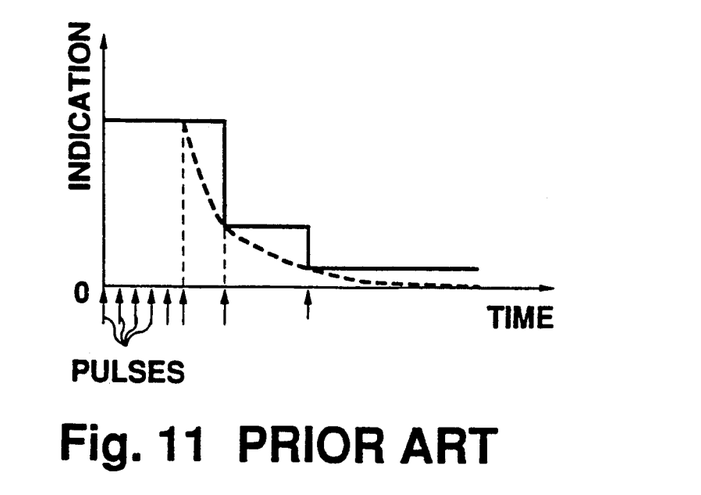
FIG. 11 shows a problem experienced in a conventional system.

With the foregoing circuit, the periods of sensor outputs are discretely measured, so that indication of the measured values are sometimes given with delay. For example, when the frequency of output pulses decreases as shown by the broken line in FIG. 11, the indication of the measured result will vary stepwise on the cross-coil meter 10 as shown by the solid line. Therefore, the indication of the cross-coil meter 10 is delayed by the amount which corresponds to the difference between the value shown by the broken line and that shown by the solid line. When no pulse output arrives from the sensor, the period counter 12 cannot count the pulse, so that the indication remains the same on the cross-coil meter 10.

SUMMARY OF THE INVENTION

It is therefore an object of this invention to provide a meter driving system which can suppress indication delay caused by a decrease in the frequency of sensor output pulses and make meters have good responsiveness and give accurate indication.

To meet the foregoing object, there is provided a meter driving system comprising: means for inputting digital data representing a period; and processing means for renewing the indications given by meters according to inputted period data. In this arrangement, when no new period data are received in a preset time after receiving previous period data from the input means, the processing means perform: a first step in which the time lapse between the receipt of the previous period data and the present moment is compared with a period represented by the previous period data; a second step in which when the time lapse is longer than the period represented by the previous period data, the time lapse is treated as current period data and is processed in a predetermined manner so as to renew the indications on the meters; and a third step in which when the period represented by the previous period data is longer than the time lapse, the period is treated as current period data and is processed in a predetermined manner so as to renew the indications on the meters.

When a period represented by digital data gradually decreases, the meter driving system will follow such a decrease so as to assure an accurate indication with little time delay.

When one meter driving system is used to operate a plurality of meters, a plurality of the input means will be provided so as to operate the processing means on a time shared basis. In this case, a plurality of meters can be operated by circuits which are small in size and less expensive compared with conventional devices. Time sharing timing can be obtained by a timer. The timer may also be used to measure the time between the previous period data and next period data.

When input signals are faster than a meter driving speed, the processing means may be devised so as to selectively process the period data from the input means and execute the first to third steps.

According to a further preferred embodiment, PWM modulators and drivers are used to operate the meters. The PWM modulators generate pulse-width modulated signals based on the output from the processing means. The drivers operate the meters in response to the pulse-width modulated signals.

When cross-coil meters are used, the PWM modulators generate two kinds of pulse-width modulated signals based on sine and cosine values of the output from the processing means. Steering logic determines indication quadrants according to the sine and cosine values. The drivers operate the meters based on the two kinds of pulse-width modulated signals and the indication quadrants.

When a means for latching the period data is used, the processing means can process the data under preferable conditions. Registers associated with respective meters enable the meters to be effectively operated by maintaining the output of the processing means. In this case, the number of PWM modulators and drivers depend upon the number of meters.

The meter indications may be renewed by frequency data, which are a reciprocal of the time lapse or the period data. In this case, the comparison in the first step is carried out by comparing the reciprocal of the time lapse and the reciprocal of the previous period.

The input means may be of a type for inputting either pulse signals or analog signals. For instance, an output of a speed sensor is inputted to the input means so as to indicate a speed. An input means of the pulse signal input type is used for a pulse output type speed sensor. On the other hand, an input means of the analog signal input type is for an analog output type speed sensor.

The pulse signal input means include counters for counting periods of pulse signals by counting the number of the reference clocks generated in a period x (x: i/1, i: a natural number) of the pulse signals. The reference clocks are periodically generated by reference clock generating circuits. In this case, a means for issuing a pulse input flag is utilized so as to indicate a pulse signal input to the processing means.

When an analog signal input means is used, an analog to digital converter is provided so as to convert an inputted analog signal into a digital signal. When a plurality of analog signals are inputted, a multiplexer is disposed before the analog to digital converter so as to selectively supply the analog signals to the converter. When the multiplexer performs its selective operation cyclically, a plurality of the analog signals can be also processed cyclically. To operate a plurality of meters, a selector is disposed after the processing means so that the selector performs its selective operation synchronously with the multiplexer.

A meter driving system having the following configuration can be realized in small size and at a reduced cost. This system comprises: a plurality of means for inputting digital data representing periods; and processing means for renewing a plurality of meter indications according to inputted period data. When no new period data are received in a preset time after reception of the previous period data from the input means, the processing means execute: a first step in which the time lapse from receipt of the previous period data until the present moment is compared with a period represented by the previous period data; a second step in which when the time lapse is longer than the period represented by the previous period data, the time lapse is treated as current period data and is processed in a predetermined manner so as to renew the meter indications, and a third step in which when the period represented by the previous period data is longer than the time lapse, the period is treated as current period data and is processed in a predetermined manner so as to renew the meter indications.

According to this invention, it is possible to realize an indicator comprising: meters; a means for inputting digital data representing periods; and a processing means for renewing the indications given on the meters according to inputted period data. When no new period data are received in a preset time after receiving previous period data from the input means, the processing means execute: a first step in which the time lapse from receipt of the previous period data until the present moment is compared with a period represented by the previous period data; a second step in which when the time lapse is longer than the period represented by the previous period data, the time lapse is treated as current period data and is processed in a predetermined manner so as to renew the meter indications, and a third step in which when the period represented by the previous period data is longer than the time lapse, the period is treated as current period data and is processed in a predetermined manner so as to renew the meter indications.

DETAILED DESCRIPTION OF PREFERRED EMBODIMENTS

The invention will be described with reference to preferred embodiments shown in the drawings.

Figure 1:
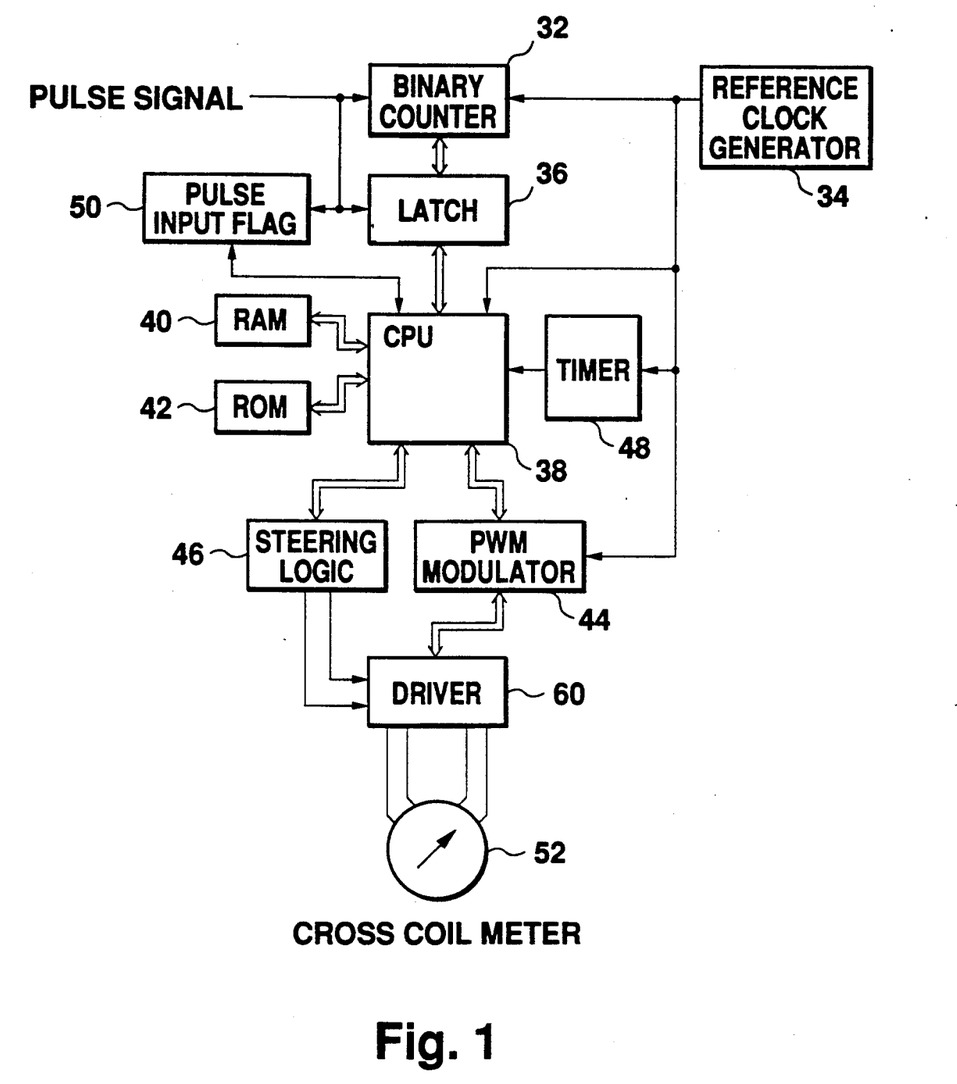
FIG. 1 is a block diagram showing the configuration of a meter driving system according to a first embodiment of the invention.

As shown in FIG. 1, a meter driving system includes a binary counter 32, which receives pulse signals from a sensor. The binary counter 32 is connected to a reference clock generator 34 for generating reference clocks, and counts the number of reference clock pulses per period between the leading or trailing edge and the next leading or trailing edge of input pulse signals.

The binary counter 32 is connected to a latch 36 for storing the period of the counted pulse signals.

A CPU 38 is connected not only to the latch 36 but also to a RAM 40 for storing data and a ROM 42 for storing a program, coefficients, and so on.

The CPU 38 is also connected to a PWM modulator 44 for performing pulse width modulation of the output signal from the CPU 38 based on sine and cosine values, steering logic 46 for determining the signs of the sine and cosine coefficients, a timer 48 for counting the reference clock pulses, and a flag generator 50 for generating a pulse input flag corresponding to the input of pulse signals. A driver 60 is connected to the PWM modulator 44 and the steering logic 46 so as to operate coils $L_S$ and $L_C$ of a cross-coil meter 52.

The steering logic 46 determines the signs of the sine and cosine coefficients. Specifically, the steering logic 46 assigns sine positive and cosine positive to the first quadrant, and sine positive and cosine negative to the second quadrant (refer to FIG. 2).

The reference clock generator 34 is connected to the CPU 38 and PWM modulator 44, both of which determine the operation timing based on the reference clocks.

The CPU 38 calculates the period of the pulse signal. When no pulse signal arrives in the time which corresponds to the period of a previous pulse signal, the CPU 38 orders the meter to indicate a value which corresponds to a reciprocal of the time elapsed after the previous pulse signal was input.

Figure 3:
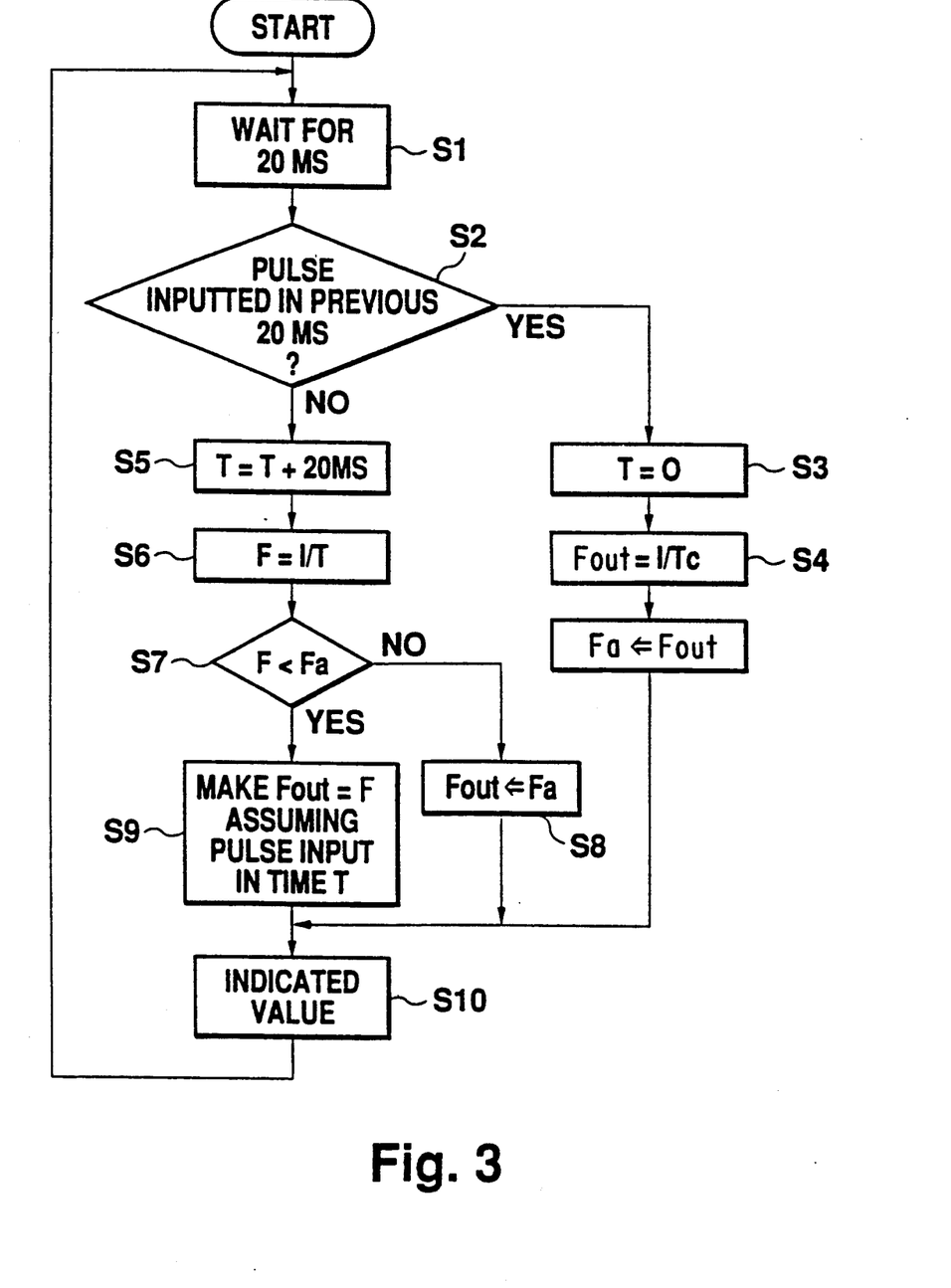
FIG. 3 is a flowchart showing the operation of the system of FIG. 1.

The operation of the driving system will be described with reference to FIG. 3.

Receiving a pulse signal, the binary counter 32 counts the reference clock pulses during a period between the leading or trailing edge and the leading or trailing edge of the input pulse signals. The period $T_C$ of the pulse signals counted by the binary counter 32 is latched by the latch 36.

The CPU 38 performs the following processing (step S1) every 20 milliseconds in response to issuance of a pulse input flag.

The CPU 38 checks the presence or absence of a pulse input between the previous processing and the current processing (step S2). When a pulse is input to the binary counter 32 and pulse input flag 50 within a preset time period, the CPU 38 resets the time from the last pulse input until the previous processing time, i.e. no-pulse-input time T, calculates an output value $F_{out}$ ($=1T_C$) based on the period $T_C$ of the pulse signal latched by the latch 36 (step S4), and sets $F_a$ equal to $F_{out}$, and stores the new $F_a$.

When no pulse input is detected in the step S2, the CPU 38 determines a new time T by adding 20 milliseconds to the previous no-pulse-input time T (step S5), calculates a frequency F ($=1/T$) for the time T (step S6), and compares the frequency F with the frequency $F_a$ associated with the last pulse input (step S7). When F is equal to or more than $F_a$, the CPU 38 calculates the output value $F_{out}$ assuming $F_{out}=F_a$ (step S8). Otherwise, when F is less than $F_a$, the CPU 38 calculates the output value $F_{out}$ assuming $F_{out}=F$ (step S9).

The CPU 38 renews the meter indication to $F_{out}$ which is calculated as described above.

Figure 4:
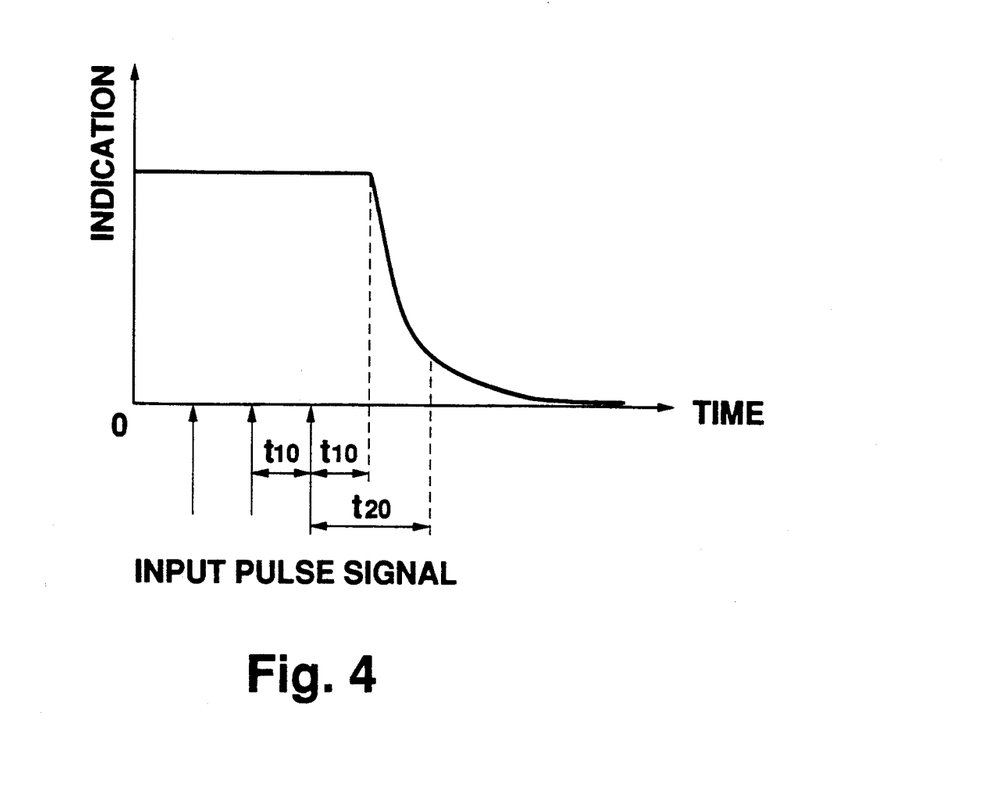
FIG. 4 shows the operation of the system of FIG. 1.

In the step S10, the CPU 38 calculates not only a deflection angle $\theta$ of the meter pointer based on the value $F_{out}$ to be indicated but also coil currents $\sin\theta$ and $\cos\theta$ corresponding to the deflection angle $\theta$. Then, the CPU 38 writes these values in a register of the PWM modulator 44. The PWM modulator 44 outputs PWM-modulated pulses based on these values. The driver 60 provides the coils $L_S$ and $L_C$ with currents according to the deflection angle $\theta$ of the meter. Thus, the meter indication is given. As shown in FIG. 4, the indicated value will decrease along the curve 1/T until the arrival of a pulse input.

Figure 2:
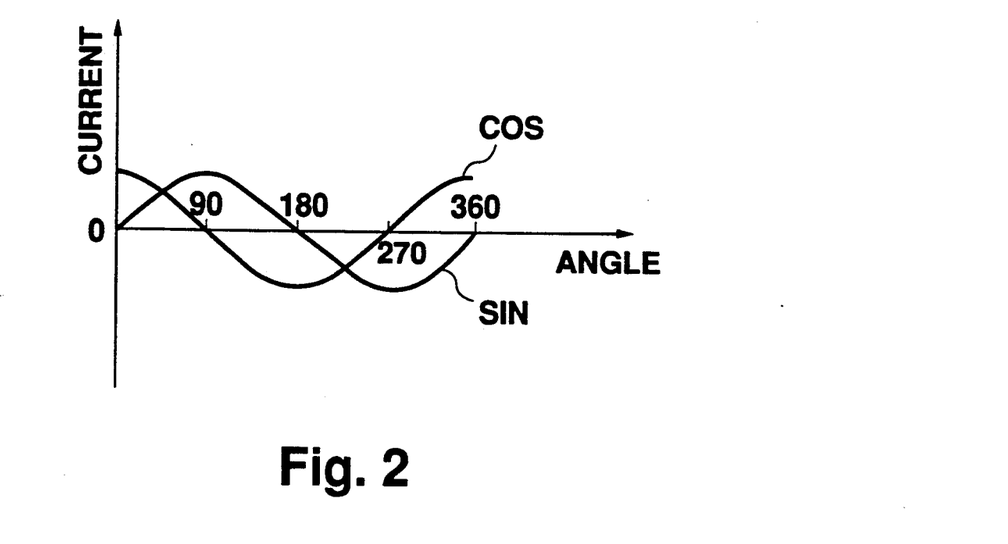
FIG. 2 shows how to determine the signs, i.e. plus or minus, in the steering logic of the system of FIG. 1.

The steering logic 46 determines the signs of the sine and cosine coefficients in two types of modulation performed by the PWM modulator 44. For example, the first quadrant of the meter represents sine positive and cosine positive, and the second quadrant represents sine positive and cosine negative.

According to this embodiment, the driving system is so designed that the meter can indicate a reciprocal of the time lapsed after the last pulse when no pulse input arrives in a preset time which corresponds to the pulse signal period. Therefore, the meter becomes very responsive to extremely low pulse signal frequencies, thereby giving very precise indication.

Figure 5:
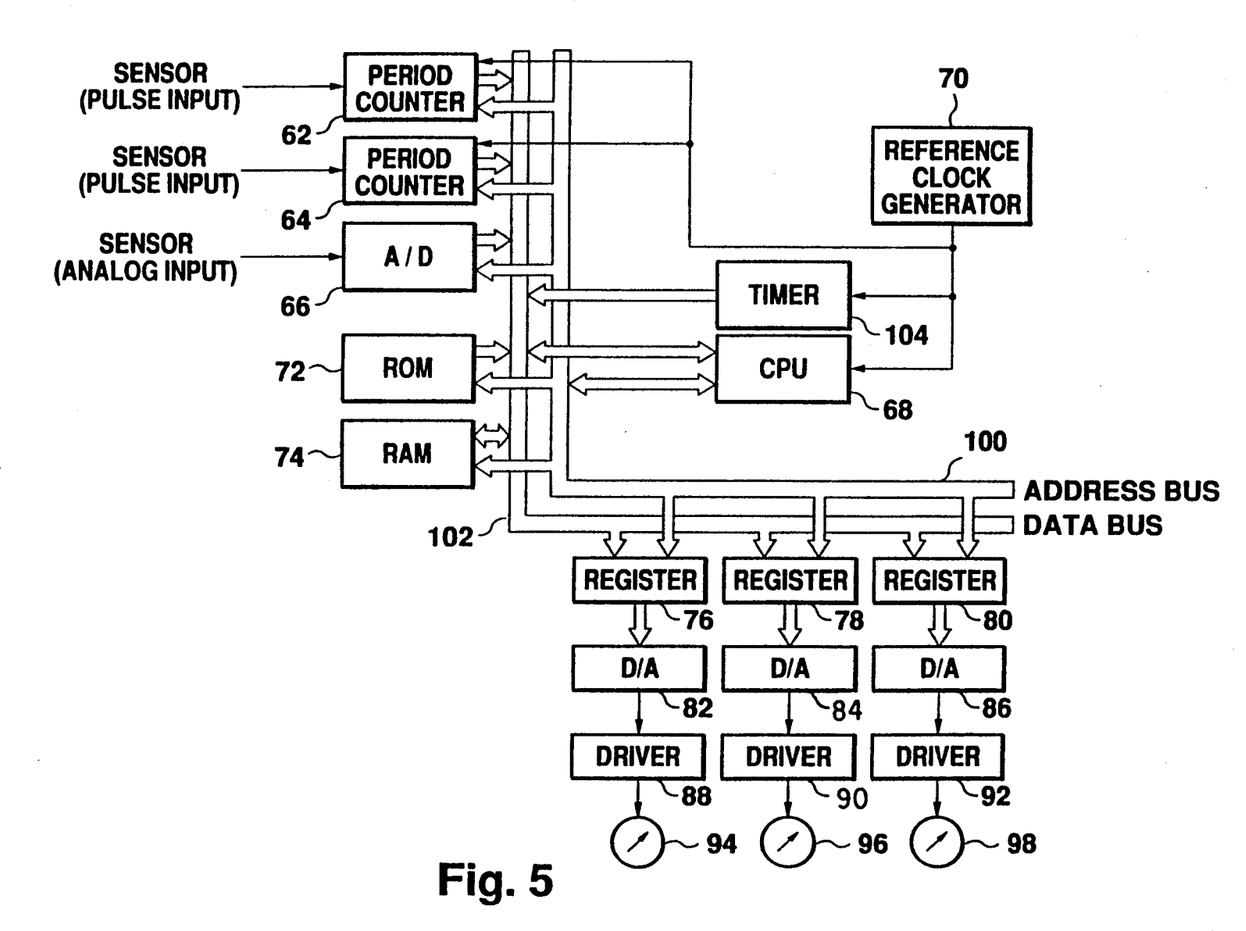
FIG. 5 is a block diagram showing the configuration of a meter driving system according to a second embodiment.

FIG. 5 shows a meter driving system according to a second embodiment of the invention. The system comprises period counters 62, 64, an analog to digital converter 66, a CPU 68, a reference clock generator 70, a ROM 72, a RAM 74, registers 76, 78, 80, digital to analog converters 82, 84, 86, drivers 88, 90, 92, cross-coil meters 94, 96, 98, an address bus 100, a data bus 102, and a timer 104.

In this embodiment, the cross-coil meters 94 to 98 are operated by the meter driving system. Inputs from three sensors are processed by the period counters 62, 64, or the analog to digital converter 66. The CPU 68 includes the timer 104 so as to control data input timing.

Operation of the driving system will be described hereinafter. The period counters 62, 64 measure the period of pulse inputs from sensors as is done by a conventional example shown in FIG. 8. The sensors for supplying pulse outputs are connected to the period counters 62, 64. The analog to digital converter 66 is connected to a sensor for analogously outputting the detected results. For example, the analog to digital converter 66 is used for a sensor whose output represents the detected result.

Outputs from the period counters 62, 64 and the analog to digital converter 66 are sent to the data bus 102. The data from the data bus 102 are received by the CPU 68 at the timing determined by the timer 104, i.e. each time the timer 104 interrupts in response to the reference clocks.

Figure 6:
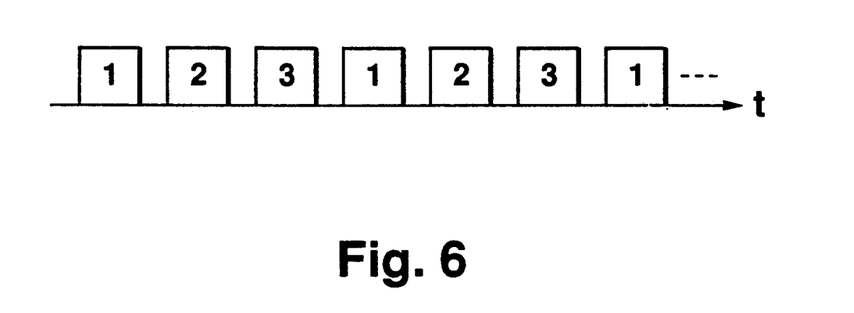
FIG. 6 shows process timing.

The CPU 68 processes the data output from the period counters 62, 64 and the analog to digital converter 66 on a time shared basis. Specifically, as shown in FIG. 6, the CPU 68 processes the output of the period counter 62 at the timing 1, the output of the period counter 64 at the timing 2, and the output of the analog to digital converter at the timing 3, respectively. The CPU 68 determines a reciprocal of the period related to the outputs of the period counters 62, 64 and the analog to digital converter 66, thereby calculating SIN (F) and COS (F) as described in connection to the first embodiment. The CPU 68 sends address data to the address bus 100 so as to receive either the outputs of the period counters 62, 64 or the output of the analog to digital converter 66.

The processed result of the CPU 68 is latched by one of the registers 76 to 80. When the data are related to the output of the period counter 62, the CPU 68 sends the address bus 100 an address representing the register 76, which then latches the processed result on the data bus 102. Similarly, the register 78 latches the processed result associated with the output of the period counter 64. The register 80 latches the processed results associated with the analog to digital converter 66. The results latched by the registers 76 to 80 are converted by the digital to analog converters 82 to 86. Then, the drivers 88 to 92 drive cross-coil meters 94 to 98 according to the analog outputs (current or voltage values).

With this embodiment, the cross-coil meter 94 is operated for the output of the period counter 62, and the cross-coil meter 96 is for the output of the period counter 64. The cross-coil meter 98 is for the output of the analog to digital converter 66. In other words, the cross-coil meters 94 to 98 are operated in response to a plurality of sensor inputs on a time shared basis. One meter driving system is effective enough to operate these cross-coil meters. This means the driving system can be made small and less expensive. It is also possible that the driving system also processes all the data by one timer interruption so as to operate all the three cross-coil meters 94 to 98.

Figure 7:
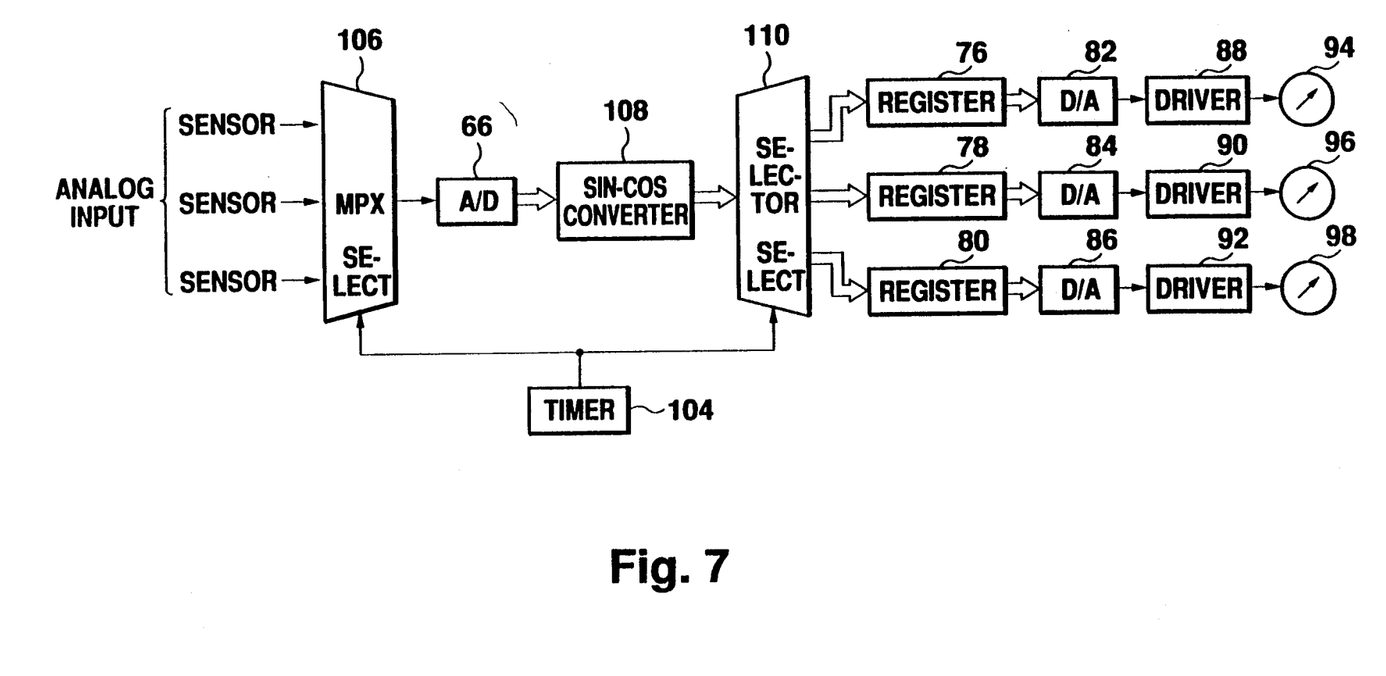
FIG. 7 is a block diagram showing the configuration of a meter driving system according to a third embodiment.

FIG. 7 shows the configuration of a meter driving system according to a third embodiment. This driving system is applicable only to sensors for outputting analog data. The analog outputs from the sensors are selectively inputted to an analog to digital converter 66 by a multiplexer (MPX) 106, which is disposed before the analog to digital converter 66. The analog to digital converter 66 converts the received data into digital data. The digital data are supplied to a SIN to COS converter 108, which determines a SIN value and a COS value based on the supplied data, sending them to a selector 110. The selector 110 sends the received output selectively to one of registers 76 to 80. The multiplexer MPX 106 and the selector 110 perform selection under control of the timer 104.

This meter driving system is as effective as the system shown in FIG. 5, but differs from the latter in that it is applicable only to sensors which handle analog outputs.

It is needless to say that the number of cross-coil meters to be operated is not limited to three, although three cross-coil meters are referred to in the foregoing description.

The timing of the timer 104 will be adjusted when the number of meters being driven is increased. Further, when the period counters 62, 64 or the analog to digital converter 66 shown in FIG. 5 outputs the data much faster than the operating speed of the cross-coil meters 94 to 98, either CPU 68 or the SIN to COS converter 108 may process the data selectively. Even when the data are selectively processed, the registers 76 to 80 are provided for the cross-coil meters 94 to 98, respectively. Therefore, no inconvenience will be caused if the cross-coil meters are operated at a slow speed. For example, if the contents of the registers 76 to 80 are renewed approximately 50 times per second, the meter indication can be given with good legibility. The CPU 68 can cope with such speed adjustment.

The meter driving systems of this invention are applicable to operation of other meters as well as cross-coil meters. In the third embodiment, the analog to digital converter 66 may be disposed before the multiplexer MPX 106. In such a case, although a plurality of analog to digital converters 66 are required, the driving system can be advantageously realized in the configuration shown in FIG. 7.

Selective processing of the data and selective latching of the registers enable adjustment of the speed difference between the speed of the sensor outputs and the meter driving speed, thereby making the meter driving speed compatible with the sensor output speeds.

What is claimed is:

1. A meter driving system for driving at least one meter means with meter indication signals, the system comprising:
   input means for inputting data signals representing time periods;
   processing means for updating the meter indication signals according to the inputted data signals;
   comparing means for comparing a first elapsed time from receipt of a previous one of the data signals from said input means until a present moment to a time period represented by the previous data signal; and
   control means for determining if a second elapsed time exceeds a preset time, said control means operating the comparing means only when the preset time is exceeded;
   wherein, when said comparing means determines that said first elapsed time is longer than the previous time period represented by the previous data signal, said first elapsed time is treated as a current time period, the processing means updating said meter indication signals based on the current time period, and
   when said comparing means determines that the previous time period represented by the previous data signal is longer than said first elapsed time, the previous time period is treated as the current time period, the processing means updating said meter indication signals based on the current time period.

2. The meter driving system of claim 1, further comprising means for latching the data signals to be supplied to said processing means.

3. The meter driving system of claim 1, wherein the control means comprises timing means for providing timing signals to at least one of said comparing means and said processing means.

4. The meter driving system of claim 1, wherein said control means comprises:
   PWM modulators for generating pulse-width modulated signals based on output signals form said processing means; and
   drivers for operating the at least one meter means in response to the pulse-width modulated signals.

5. The meter driving system of claim 1, wherein the control means comprises:
   a PWM modulator for generating two types of pulse-width modulated signals according to sine and cosine values of output signals from said processing means;
   steering logic for determining indication quadrants in the at least one meter means based on the sine and cosine values; and
   a driver for operating the at least one meter means according to the two types of pulse-width modulated signals and the determined indication quadrants.

6. The meter driving system of claim 1, wherein the comparing means compares data corresponding to a reciprocal of the first elapsed time and data corresponding to a reciprocal of the previous time period.

7. The meter driving system of claim 1, wherein the meter indications are updated based on data corresponding to a reciprocal of the current time period.

8. The meter driving system of claim 1, wherein said input means includes counting means for counting input pulse signals.

9. The meter driving system of claim 8, wherein said counting means comprises:
   reference clock generating means for generating reference clock pulses periodically; and
   counter means for determining time periods of pulse signals by counting the reference clock pulses generated in a predetermined period of the input data signals.

10. The meter driving system of claim 8, further comprising flag means for issuing a pulse input flag signal indicating receipt of one input data signal input to said processing means.

11. The meter driving system of claim 1, wherein said input means includes an analog to digital converter for converting an analog signal into a digital signal.

12. The meter driving system of claim 1, wherein at least one input means is provided according to a number of said at least one meter means, and said processing means updates the meter indications of said at least one meter means on a time shared basis.

13. The meter driving system of claim 12, further including time sharing means for supplying time sharing timing signals to said processing means.

14. The meter driving system of claim 12, further comprising at least one register provided according to the number of the at least one meter means and storing output signals of said processing means.

15. The meter driving system of claim 12, further comprising:
   at least one PWM modulation means for generating pulse-width modulated signals for respective ones of the at least one meter means based on the stored output signals of said processing means; and
   at least one driver means for operating said at least one meter means respectively, in response tot he pulse-width modulated signals.

16. The meter driving system of claim 12, wherein said control means operates the comparing means by selectively processing the period data signals from said input means at a preset rate.

17. The meter driving system of claim 1, wherein said input means comprises:
   an analog to digital converter for converting analog signals into digital data signals and outputting the digital data signals as the data signals to said processing means; and
   multiplexer means positioned preceding said analog to digital converter for selecting any one of a plurality of input analog signals and for supplying the selected analog signal to said analog to digital converter.

18. The meter driving system of claim 17, wherein the at least one meter means comprises a plurality of meters, the meter drive system further comprising:
   selector means connected to an output of said processing means for selectively directing an output from said processing means and for supplying the selected output to any one of said plurality of meters; and
   wherein the control means synchronously operates said multiplexer means and said selector means.

19. A meter driving system for driving a plurality of meter means with meter indication signals, the system comprising:
   a plurality of input means for inputting data signals representing time periods;
   processing means for updating a plurality of meter indication signals for the plurality of meter means according to the inputted period data signals;
   whereby when no new period data are received in a preset time after receipt of the previous period data from said input means, said processing means execute:
   comparing means for comparing a first elapsed time period from receipt of a previous one of the period data signals from one of said plurality of input means until a present moment to a time period represented by the previous period data signal from said one input means; and
   control means for determining if a second elapsed time period exceeds a preset time period, said control means operating the comparing means only when the preset time period is exceeded;
   wherein when said comparing means determines that said first elapsed time is longer than the previous time period represented by the previous data signal, said first elapsed time is treated as a current time period, the processing means updating said meter indication signals of a corresponding one of the plurality of meter means based on the current time period of said one input means, and
   when said comparing means determines that the previous tim period represented by the previous data signal from said one input means is longer than said first elapsed time, the previous time period is treated as the current time period, the processing means updating said meter indication signals of the corresponding meter means based on the current time period.

20. An indicator comprising:
   a plurality of meters;
   input means for inputting data signals representing time periods;
   processing means for updating meter indication signals of said plurality of meters according to the inputted data signals;
   comparing means for comparing a first elapsed time from receipt of a previous one of the data signals from said input means until a present moment to a time period represented by the previous period data signal;
   control means for determining if a second elapsed time period exceeds a preset time period, said control means operating the comparing means only when the preset time period is exceeded;
   wherein when said comparing means determines that said first elapsed time is longer than the previous time period represented by the previous data signal, said first elapsed time period is treated as a current time period, the processing means updating said meter indication signals based on the current time period, and
   when said comparing means determines that the previous time period represented by the previous data signal is longer than said first elapsed time, the previous time period is treated as the current time period, the control means updating said meter indication signals based on the current time period.

21. A method for driving at least one meter, comprising the steps of:
   inputting data signals representing time periods;
   updating meter indication signals according to the inputted data signals;
   determining whether a new data signal is inputted within a preset time of a previous data signal; and
   wherein, when said new data signal is not input, the method further comprises the steps of:
   comparing an elapsed time, from receipt of the previous data signal until a present moment, to a previous time period represented by the previous data signal;
   updating said meter indication signals using said elapsed time when said elapsed time is longer than the previous time period; and
   updating said meter indication signals using said previous tim period when the previous time period is longer than said elapsed time.

22. The method of claim 21, wherein said inputting step comprises latching the data signals.

23. The method of claim 21, wherein the updating step comprises the steps of:

generating pulse-width modulated signals based on the inputted time period data signal; and driving the at least one meter based on the pulse-width modulated signals.

24. The method of claim 23, wherein the generating step comprises the steps of:

generating a sine-type pulse-width modulates signal; and generating a cosine-type pulse-width modulated signal.

25. The method of claim 21, wherein the first comparing step comprises:

comparing a reciprocal of the elapsed time period to a reciprocal of the previous time period.

26. The method of claim 25, wherein the second updating step comprises driving the at least one meter based on the reciprocal of the previous time period.

* * * * *